(12) United States Patent
Chang

(10) Patent No.: US 10,867,158 B2
(45) Date of Patent: Dec. 15, 2020

(54) PROCESS FOR MAKING A FINGERPRINT SENSOR PACKAGE MODULE AND THE FINGERPRINT SENSOR PACKAGE MODULE MADE THEREBY

(71) Applicant: Tong Hsing Electronic Industries, Ltd., Taipei (TW)

(72) Inventor: Chia-Shuai Chang, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 0 days.

(21) Appl. No.: 16/453,278

(22) Filed: Jun. 26, 2019

(65) Prior Publication Data

US 2020/0005016 A1    Jan. 2, 2020

(30) Foreign Application Priority Data

Jun. 29, 2018   (TW) .............................. 107122571 A

(51) Int. Cl.
*G06K 9/00* (2006.01)
*G06K 9/20* (2006.01)
*H01L 27/146* (2006.01)

(52) U.S. Cl.
CPC ......... *G06K 9/00053* (2013.01); *G06K 9/209* (2013.01); *H01L 27/14618* (2013.01); *H01L 27/14636* (2013.01); *H01L 27/14678* (2013.01); *H01L 27/14683* (2013.01)

(58) Field of Classification Search
CPC .................... G06K 9/00053; H01L 27/14683
See application file for complete search history.

(56) References Cited

U.S. PATENT DOCUMENTS

| 9,978,673 | B2 | 5/2018 | Tang et al. | |
| 2017/0017823 | A1* | 1/2017 | Chang | H01L 23/49827 |
| 2019/0295858 | A1* | 9/2019 | Athavale | H01L 21/6835 |

FOREIGN PATENT DOCUMENTS

| TW | M494972 U | 2/2015 |
| TW | 201812933 A | 4/2018 |

OTHER PUBLICATIONS

Search Report appended to an Office Action, which was issued to Taiwanese counterpart application No. 107122571 by the TIPO on Mar. 20, 2020, with an English translation thereof.

* cited by examiner

*Primary Examiner* — William Coleman
(74) *Attorney, Agent, or Firm* — Hamre, Schumann, Mueller & Larson, P.C.

(57) ABSTRACT

A method for making a fingerprint sensor package module includes the steps of: providing a substrate, disposing a fingerprint sensor chip over a mounting region of the substrate, forming a masking layer on a sensing region of the fingerprint sensor chip, electrically connecting the substrate to the fingerprint sensor chip, molding an encapsulation structure, and removing the masking layer to expose the sensing region of the fingerprint sensor chip.

11 Claims, 8 Drawing Sheets

PROCESS FOR MAKING A FINGERPRINT SENSOR PACKAGE MODULE AND THE FINGERPRINT SENSOR PACKAGE MODULE MADE THEREBY

CROSS-REFERENCE TO RELATED APPLICATION

This application claims priority of Taiwanese Application No. 107122571, filed on Jun. 29, 2018.

FIELD

The disclosure relates to a process for making a fingerprint sensor package module and the fingerprint sensor package module made by the process.

BACKGROUND

In a process for making a fingerprint sensor package module, an encapsulation procedure is usually required after mounting components of the fingerprint sensor package module so as to protect these components. However, during the encapsulation procedure, encapsulating material used is liable to overflow such that a sensing region of a fingerprint sensor chip may be stained by the encapsulating material, thereby reducing sensitivity of the fingerprint sensor chip and production yield of the fingerprint sensor package module.

The fingerprint sensor package module is commonly used in various electronic devices such as mobile phones, notebook computers, and the like. Since the space for installing the fingerprint sensor package module in these electronic devices is limited, it is desirable for those skilled in the art to miniaturize the size of the fingerprint sensor package module.

SUMMARY

Therefore, a first object of the disclosure is to provide a process for making a fingerprint sensor package module to overcome the aforesaid shortcomings of the prior art.

A second object of the disclosure is to provide the fingerprint sensor package module made by the process.

According to a first aspect of the disclosure, there is provided a process for making a fingerprint sensor package module which comprises the steps of:

a) providing a substrate having an upper surface, which includes a mounting region and a surrounding region surrounding the mounting region;

b) disposing a fingerprint sensor chip over the mounting region of the substrate with a bottom surface and a top surface of the fingerprint sensor chip respectively proximate to and distal from the upper surface of the substrate, the top surface including a sensing region and an encapsulated region surrounding the sensing region;

c) forming a masking layer on the sensing region of the fingerprint sensor chip;

d) electrically connecting the substrate to the fingerprint sensor chip;

e) molding an encapsulation structure which overlies the encapsulated region of the fingerprint sensor chip and the surrounding region of the substrate and which confines the masking layer; and f) removing the masking layer to expose the sensing region of the fingerprint sensor chip.

According to a second aspect of the disclosure, there is provided a fingerprint sensor package module made by the process according to the disclosure in which each of electric contacts provided on an encapsulated region of a top surface of a fingerprint sensor chip is spaced apart from a sensing region of the top surface of the fingerprint sensor chip by a distance of less than 300 µm.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
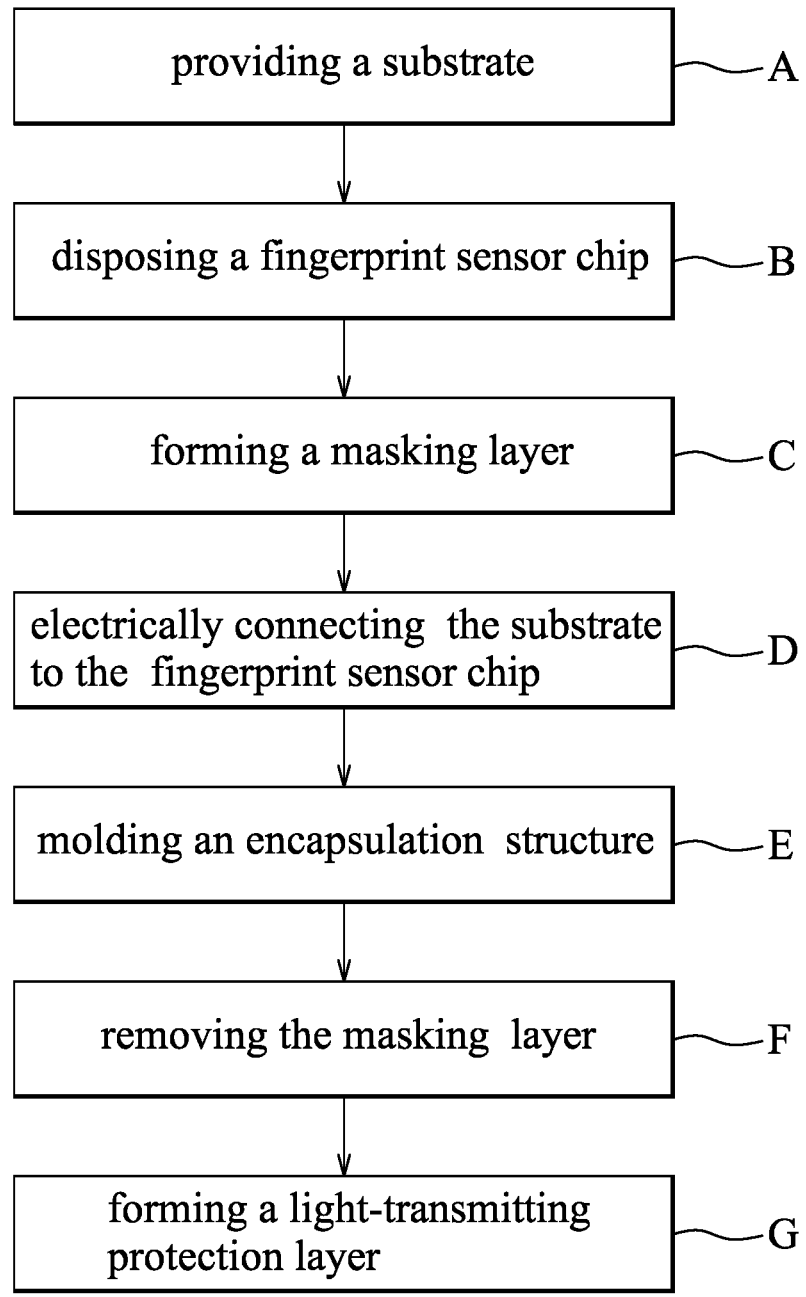
FIG. 1 is a flow diagram of a first embodiment of a process for making a fingerprint sensor package module according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 1 to 8, a first embodiment of a process for making a fingerprint sensor package module 10 according to the disclosure includes the steps of: (A) providing a substrate 1, (B) disposing a fingerprint sensor chip 2, (C) forming a masking layer 6, (D) electrically connecting the substrate 1 to the fingerprint sensor chip 2, (E) molding an encapsulation structure 4, (F) removing the masking layer 6, and (G) forming a light-transmitting protection layer 5.

Figure 2:
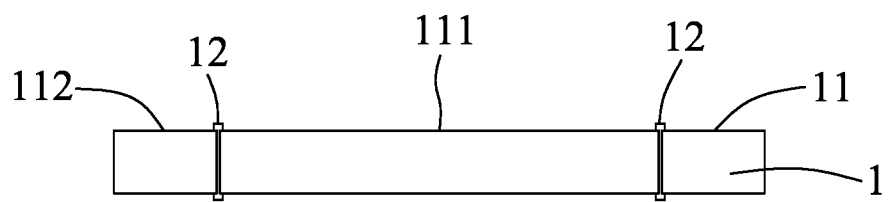
FIGS. 2 to 8 are schematic views showing consecutive steps of the first embodiment of FIG. 1.

Specifically referring to FIG. 2, the substrate 1 provided in step (A) may be made from resin, a mixture of resin and glass fibers, ceramic material, glass, or the like, and has an upper surface 11. The upper surface 11 includes a mounting region 111 and a surrounding region 112 surrounding the mounting region 111. The surrounding region 112 of the substrate 1 is provided with a plurality of circuit contacts 12.

Figure 3:
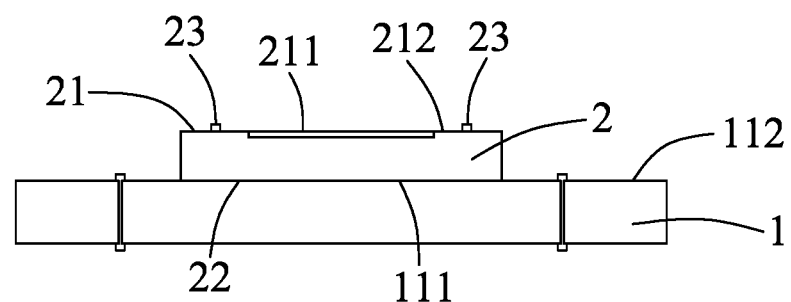

Specifically referring to FIG. 3, in step (B), the fingerprint sensor chip 2 is disposed over the mounting region 111 of the substrate 1. In this embodiment, specifically, the fingerprint sensor chip 2 is disposed on and adhered to the mounting region 111 of the substrate 1 via an adhesive layer (now shown). It should be noted that the fingerprint sensor chip 2 may be fixed on the mounting region 111 of the substrate 1 using other methods well known in the art. The fingerprint sensor chip 2 has a bottom surface 22 proximate to the upper surface 11 of the substrate 1 and a top surface 21 distal from the upper surface 11 of the substrate 1. The top surface 21 of the fingerprint sensor chip 2 includes a sensing region 211 and an encapsulated region 212 surrounding the sensing region 211. The encapsulated region 212 of the fingerprint sensor chip 2 is provided with a plurality of electric contacts 23.

Figure 4:
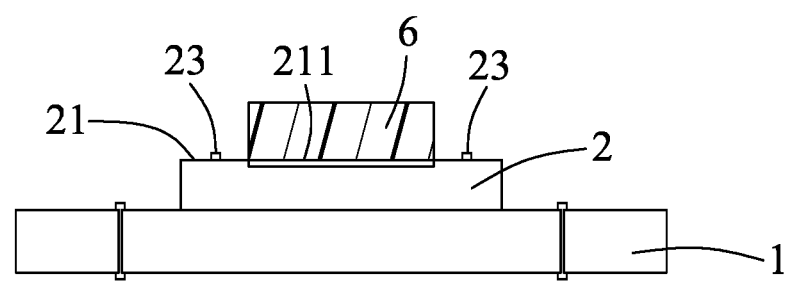

Specifically referring to FIG. 4, in step (C), the masking layer 6 is formed on the sensing region 211 of the fingerprint sensor chip 2 via photolithography using a photosensitive material. Specifically, the masking layer 6 is formed by applying a liquid photoresist layer or a dry film photoresist layer on the top surface 21 of the fingerprint sensor chip 2, followed by exposure, development, and the like to remove undesirable regions of the photoresist layer. It should be noted that the masking layer 6 may be formed on the sensing region 211 of the fingerprint sensor chip 2 using other methods well known in the art. When the masking layer 6 is formed on the sensing region 211 of the fingerprint sensor chip 2 using methods other than the photolithography, step C) may be implemented prior to step B).

Figure 5:
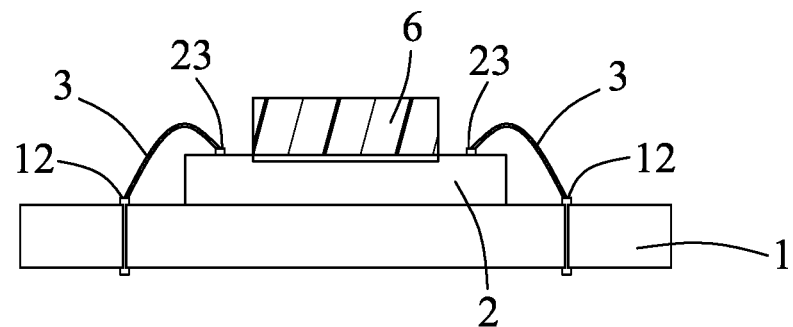

Specifically referring to FIG. 5, in step (D), the substrate 1 is electrically connected to the fingerprint sensor chip 2 by wire bonding to form a plurality of metal conductive wires 3, each of which permits a respective one of the circuit contacts 12 to electrically connect a respective one of the electric contacts 23 so as to establish an electrical interconnection between the substrate 1 and the fingerprint sensor chip 2. Specifically, the wire bonding may be implemented using, for example, a supersonic soldering technique, but is not limited thereto.

Figure 6:
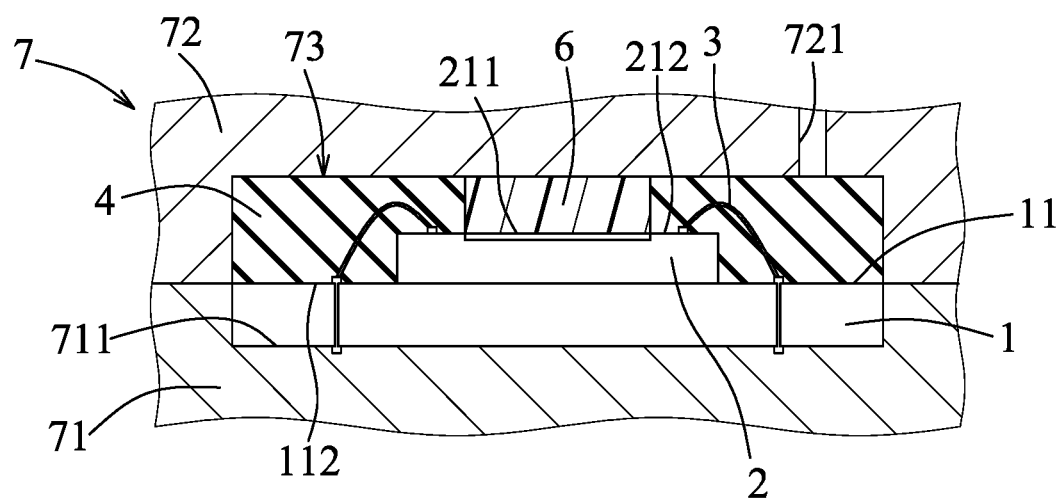

Specifically referring to FIG. 6, in step (E), the encapsulation structure 4 is formed via a molding technique to overlie the encapsulated region 212 of the fingerprint sensor chip 2 and the surrounding region 112 of the substrate 1, to encapsulate the metal conductive wires 3, and to confine the masking layer 6. Specifically, the substrate 1 together with the fingerprint sensor chip 2 and the metal conductive wires 3 is disposed on a lower positioning surface 711 of a lower mold 71. An upper mold 72 is then mounted on the lower mold 71 to define a mold cavity 73. A liquid plastic material such as an epoxy resin is injected into the mold cavity 73 via an injection runner 721 to overlie the encapsulated region 212 of the fingerprint sensor chip 2 and the surrounding region 112 of the substrate 1 and to encapsulate the metal conductive wires 3, followed by solidification of the liquid plastic material to form the encapsulation structure 4. Since the masking layer 6 is formed on the sensing region 211 of the fingerprint sensor chip 2, the liquid plastic material and the encapsulation structure 4 formed therefrom are not in touch with the sensing region 211 of the fingerprint sensor chip 2. It should be noted that the encapsulation structure 4 may be formed using other methods well known in the art, for example, a glue-pouring process, a film-assisted molding technique, and the like.

Figure 7:
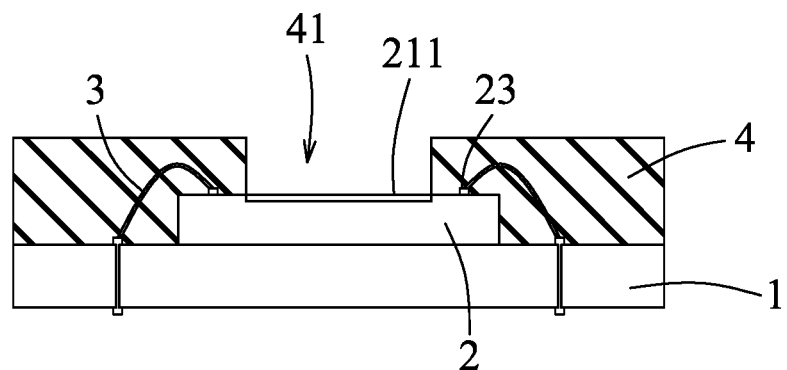

Specifically referring to FIG. 7, in step (F), the masking layer 6 is removed to permit the encapsulation structure 4 to be formed with a well 41 extending downward to the sensing region 211 of the fingerprint sensor chip 2 so as to expose the sensing region 211 of the fingerprint sensor chip 2 via the well 41. Removal of the masking layer 6 can be implemented using a neutral agent which can dissolve the masking layer 6 (i.e., the photosensitive material) and which is not reactive with other components of the fingerprint sensor package module 10. It should be noted that if the masking layer 6 is made from a material other than the photosensitive material, the masking layer 6 may be removed using other physical and/or chemical methods well known in the art.

Since the masking layer 6 is formed on the sensing region 211 of the fingerprint sensor chip 2 prior to molding of the encapsulation structure 4, the liquid plastic material for forming the encapsulation structure 4 cannot flow to and be in touch with the sensing region 211 of the fingerprint sensor chip 2. Therefore, the sensitivity of the sensing region 211 of the fingerprint sensor chip 2 will not be undesirably reduced. In order to prevent the liquid plastic material for forming the encapsulation structure 4 from being in touch with the sensing region 211 of the fingerprint sensor chip 2, it is conventionally required that each of the electric contacts 23 is spaced apart from the sensing region 211 of the fingerprint sensor chip 2 by a sufficient distance. However, in the first embodiment of the process for making the fingerprint sensor package module 10 of the disclosure, the masking layer 6 is formed precisely on the sensing region 211 of the fingerprint sensor chip 2 by photolithography prior to molding of the encapsulation structure 4, thus the distance (S) between each of the electric contacts 23 and the sensing region 211 of the fingerprint sensor chip 2 can be significantly reduced, for example, to a value of less than 300 μm. Therefore, the size of the fingerprint sensor package module 10 thus made can be effectively miniaturized.

Figure 8:
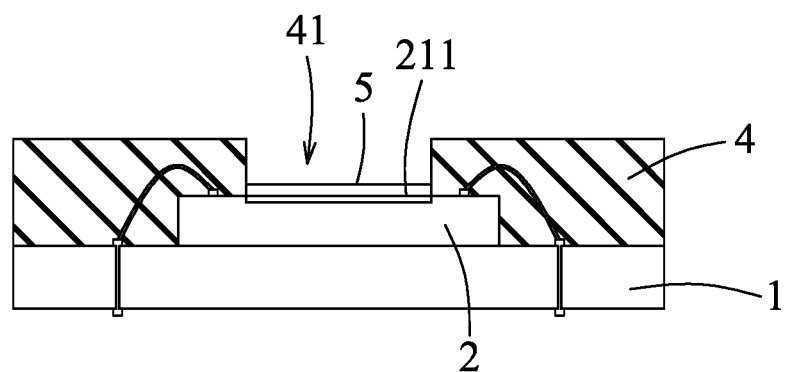
Figure 9:
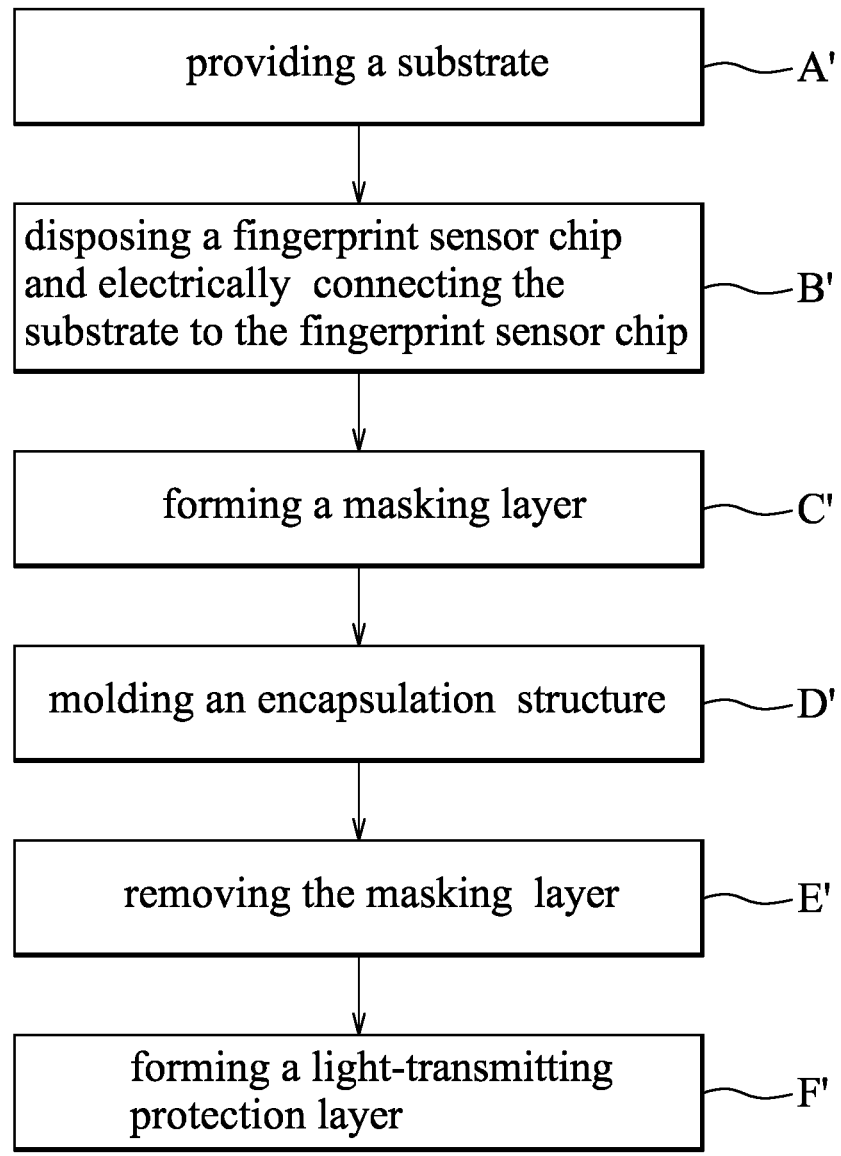
FIG. 9 is a flow diagram of a second embodiment of a process for making a fingerprint sensor package module according to the disclosure.

Specifically referring to FIG. 8, in step (G), the light-transmitting protection layer 5 is formed within the well 41 to overlie the sensing region 211 of the fingerprint sensor chip 2. The light-transmitting protection layer 5 may be made from, for example, a resin material. It should be noted that step (G) may be omitted, if desirable.

Referring to FIGS. 9 to 15, a second embodiment of a process for making a fingerprint sensor package module 10 according to the disclosure includes the steps of: (A') providing a substrate 1, (B') disposing a fingerprint sensor chip 2 and electrically connecting the substrate 1 to the fingerprint sensor chip 2, (C') forming a masking layer 6, (D') molding an encapsulation structure 4, (E') removing the masking layer 6, and (F') forming a light-transmitting protection layer 5.

Figure 10:
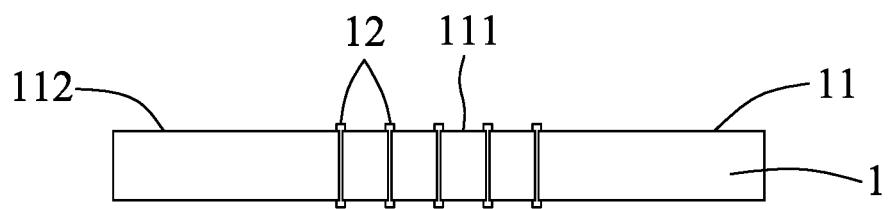
FIGS. 10 to 15 are schematic views showing consecutive steps of the second embodiment of FIG. 9.

Specifically referring to FIG. 10, the substrate 1 provided in step (A') has an upper surface 11, which includes a mounting region 111 and a surrounding region 112 surrounding the mounting region 111. The mounting region 111 of the substrate 1 is provided with a plurality of circuit contacts 12.

Figure 11:
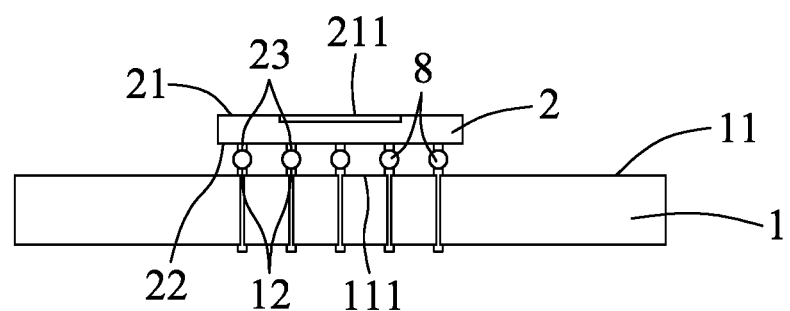

Specifically referring to FIG. 11, in step (B'), the fingerprint sensor chip 2 is disposed over the mounting region 111 of the substrate 1. The fingerprint sensor chip 2 has a bottom surface 22 proximate to the upper surface 11 of the substrate 1 and a top surface 21 distal from the upper surface 11 of the substrate 1. In the second embodiment, the bottom surface 22 of the fingerprint sensor chip 2 is provided with a plurality of electric contacts 23. The substrate 1 is electrically connected to the fingerprint sensor chip 2 by flip-chip bonding to permit each of the circuit contacts 12 to electrically connect a respective one of the electric contacts 23 so as to establish an electrical interconnection between the substrate 1 and the fingerprint sensor chip 2. Specifically, the fingerprint sensor chip 2 is disposed over the mounting region 111 of the substrate 1 in a flip-chip manner such that each of the circuit contacts 12 provided on the mounting region 111 of the substrate 11 is electrically connected to a respective one of the electric contacts 23 provided on the bottom surface 22 of the fingerprint sensor chip 2 by melting solder balls 8 that are disposed between the circuit contacts 12 and the electric contacts 23.

Figure 12:
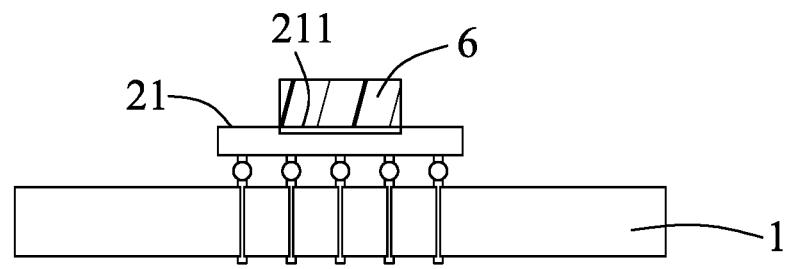

Specifically referring to FIG. 12, step (C') in the second embodiment of the process for making a fingerprint sensor package module 10 according to the disclosure is substantially the same as step (C) in the first embodiment of the process according to the disclosure, and thus will not be described here.

Figure 13:
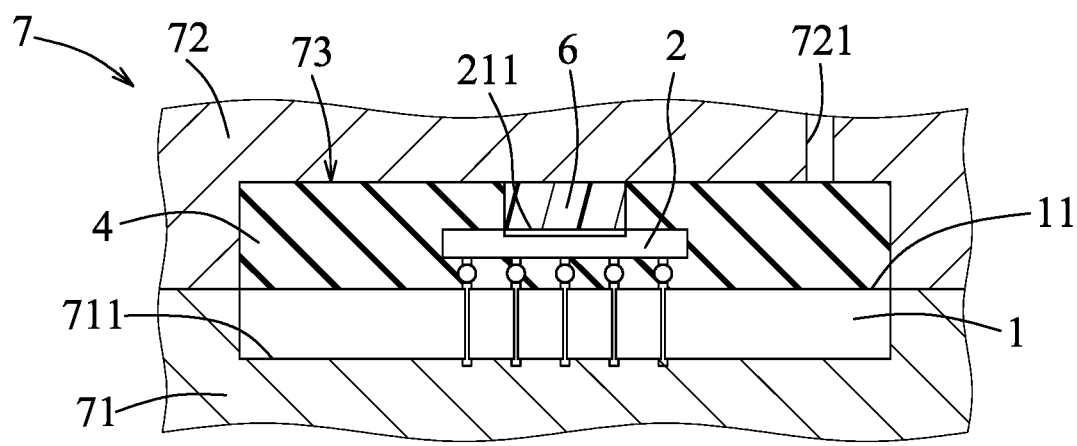

Specifically referring to FIG. 13, step (D') in the second embodiment of the process for making a fingerprint sensor package module 10 according to the disclosure is substantially the same as step (E) in the first embodiment of the process according to the disclosure, except that there is a space formed between the fingerprint sensor chip 2 and the substrate 1 because the fingerprint sensor chip 2 is disposed over and is electrically connected to the substrate 1 via flip-chip bonding and that the encapsulation structure 4 formed in step (D') fills into the space between the fingerprint sensor chip 2 and the substrate 1.

Figure 14:
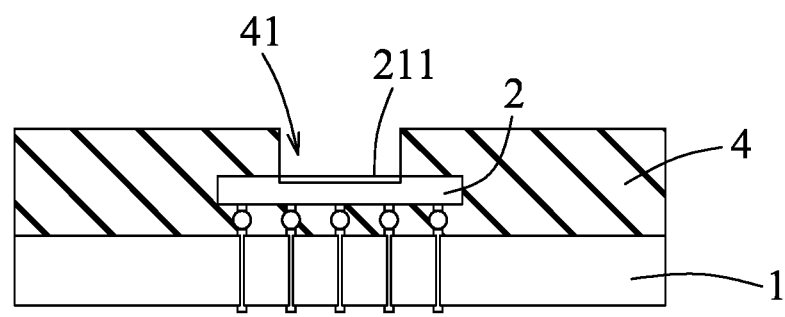

Specifically referring to FIG. 14, step (E') in the second embodiment of the process for making a fingerprint sensor package module 10 according to the disclosure is substantially the same as step (F) in the first embodiment of the process according to the disclosure, and thus will not be described here.

Figure 15:
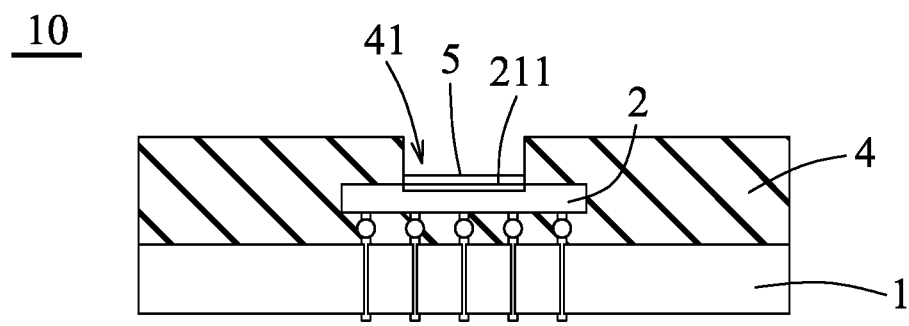

Specifically referring to FIG. 15, step (F') in the second embodiment of the process for making a fingerprint sensor package module 10 according to the disclosure is substantially the same as step (G) in the first embodiment of the process according to the disclosure, and thus will not be described here.

Figure 16:
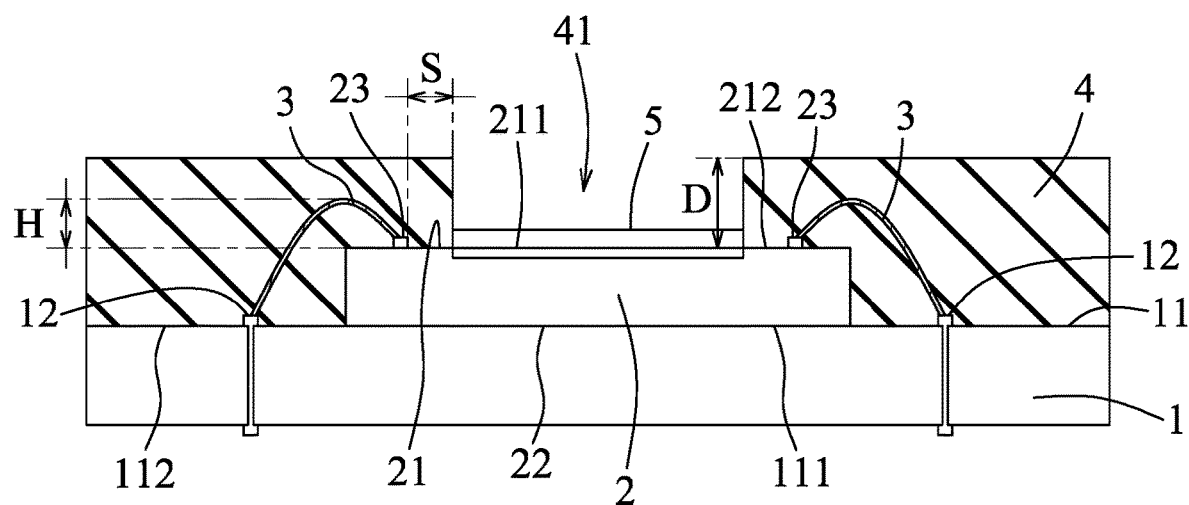
FIG. 16 is a schematic sectional view of an embodiment of a fingerprint sensor package module according to the disclosure.

Referring to FIG. 16, an embodiment of a fingerprint sensor package module 10 made by the first embodiment of the process according to the disclosure includes a substrate 1, a fingerprint sensor chip 2, a plurality of metal conductive wires 3, an encapsulation structure 4, and a light-transmitting protection layer 5.

The substrate 1 has an upper surface 11 which includes a mounting region 111 and a surrounding region 112. The surrounding region 112 surrounds the mounting region 111 and is provided with a plurality of circuit contacts 12.

The fingerprint sensor chip 2 is disposed on the mounting region 111 of the substrate 1, and has a bottom surface 22 and a top surface 21 respectively proximate to and distal from the upper surface 11 of the substrate 1. The top surface 21 includes a sensing region 211 and an encapsulated region 212, which surrounds the sensing region 211 and which is provided with a plurality of electric contacts 23. Each of the electric contacts 23 is spaced apart from the sensing region 211 of the fingerprint sensor chip 2 by a distance (S) of less than 300 µm.

Each of the metal conductive wires 3 permits a respective one of the circuit contacts 12 to electrically connect a respective one of the electric contacts 23 so as to establish an electrical interconnection between the substrate 1 and the fingerprint sensor chip 2.

The encapsulation structure 4 defines a well 41 which extends downward to the sensing region 211 of the fingerprint sensor chip 2, and which overlies the encapsulated region 212 of the fingerprint sensor chip 2 and the surrounding region 112 of the substrate 1 so as to encapsulate the metal conductive wires 3. The encapsulation structure 4 can be made from, for example, an epoxy resin and is used to, for example, protect the metal conductive wires 3 from being destroyed, isolate moisture so as to prevent the moisture from being in touch with the fingerprint sensor chip 2, and enhance heat dissipation of the fingerprint sensor chip 2 so as to prevent the fingerprint sensor chip 2 from overheating.

The light-transmitting protection layer 5 has high hardness and high light transmission, and is formed within the well 41 to overlie the sensing region 211 of the fingerprint sensor chip 2 so as to protect the sensing region 211 of the fingerprint sensor chip 2 from being damaged and/or scratched. The light-transmitting protection layer 5 has a thickness which is smaller than a depth (D) of the well 41, and which is smaller than a distance (H) between a top of each of the metal conductive wires 3 and the top surface 21 of the fingerprint sensor chip 2 so as not to affect the sensitivity of the sensing region 211 of the fingerprint sensor chip 2.

In view of the aforesaid, in the process for making the fingerprint sensor package module 10 according to the disclosure, since the masking layer 6 is formed on the sensing region 211 of the fingerprint sensor chip 2 prior to molding of the encapsulation structure 4, the liquid plastic material for forming the encapsulation structure 4 cannot flow to and be in touch with the sensing region 211 of the fingerprint sensor chip 2. Therefore, the sensitivity of the sensing region 211 of the fingerprint sensor chip 2 will not be undesirably reduced. In addition, since the masking layer 6 is formed precisely on the sensing region 211 of the fingerprint sensor chip 2 by photolithography, the distance between each of the electric contacts 23 and the sensing region 211 of the fingerprint sensor chip 2 can be significantly reduced, for example, to a value of less than 300 µm. Therefore, the size of the fingerprint sensor package module 10 thus made can be effectively miniaturized.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A process for making a fingerprint sensor package module, comprising the steps of:
   a) providing a substrate having an upper surface, which includes a mounting region and a surrounding region surrounding the mounting region;
   b) disposing a fingerprint sensor chip over the mounting region of the substrate with a bottom surface and a top surface of the fingerprint sensor chip respectively proximate to and distal from the upper surface of the substrate, the top surface including a sensing region and an encapsulated region surrounding the sensing region;
   c) forming a masking layer on the sensing region of the fingerprint sensor chip;
   d) electrically connecting the substrate to the fingerprint sensor chip;
   e) molding an encapsulation structure which overlies the encapsulated region of the fingerprint sensor chip and the surrounding region of the substrate and which confines the masking layer;
   f) removing the masking layer to expose the sensing region of the fingerprint sensor chip; and g) forming a light-transmitting protection layer which overlies the sensing region of the fingerprint sensor chip.

2. The process according to claim 1, wherein step c) is implemented by photolithography using a photosensitive material.

3. The process according to claim 1, wherein in step a), the surrounding region of the substrate is provided with a plurality of circuit contacts.

4. The process according to claim 1, wherein in step a), the mounting region of the substrate is provided with a plurality of circuit contacts.

5. The process according to claim 3, wherein in step b), the encapsulated region of the fingerprint sensor chip is provided with a plurality of electric contacts.

6. The process according to claim 5, wherein step d) is implemented by wire bonding to form a plurality of metal conductive wires, each of which permits a respective one of the circuit contacts to electrically connect a respective one of the electric contacts so as to establish an electrical interconnection between the substrate and the fingerprint sensor chip.

7. A fingerprint sensor package module made by the process according to claim 5, wherein each of said electric contacts is spaced apart from said sensing region of said fingerprint sensor chip by a distance of less than 300 μm, the fingerprint sensor package module further comprising a light-transmitting protection layer overlying said sensing region of said fingerprint sensor chip.

8. The process according to claim 6, wherein in step e), the metal conductive wires are encapsulated by the encapsulation structure.

9. The fingerprint sensor package module according to claim 7, wherein said encapsulation structure is formed with a well which extends downward to said sensing region of said fingerprint sensor chip and which has a depth larger than a thickness of said light-transmitting protection layer.

10. The process according to claim 4, wherein in step b), the bottom surface of the fingerprint sensor chip is provided with a plurality of electric contacts.

11. A process for making a fingerprint sensor package module, comprising the steps of:
  a) providing a substrate having an upper surface, which includes a mounting region and a surrounding region surrounding the mounting region, the mounting region of the substrate being provided with a plurality of circuit contacts;
  b) disposing a fingerprint sensor chip over the mounting region of the substrate with a bottom surface and a top surface of the fingerprint sensor chip respectively proximate to and distal from the upper surface of the substrate, the top surface including a sensing region and an encapsulated region surrounding the sensing region, the bottom surface of the fingerprint sensor chip being provided with a plurality of electric contacts;
  c) forming a masking layer on the sensing region of the fingerprint sensor chip;
  d) electrically connecting the substrate to the fingerprint sensor chip;
  e) molding an encapsulation structure which overlies the encapsulated region of the fingerprint sensor chip and the surrounding region of the substrate and which confines the masking layer; and
  f) removing the masking layer to expose the sensing region of the fingerprint sensor chip, wherein step d) is implemented by flip-chip bonding to permit each of the circuit contacts to electrically connect a respective one of the electric contacts so as to establish an electrical interconnection between the substrate and the fingerprint sensor chip.

* * * * *